(12) United States Patent
Wang

(10) Patent No.: US 7,456,458 B2
(45) Date of Patent: Nov. 25, 2008

(54) DYNAMIC RANDOM ACCESS MEMORY STRUCTURE

(75) Inventor: Ting Sing Wang, Hsinchu (TW)

(73) Assignee: Promos Technologies Inc. (TW)

( * ) Notice: Subject to any disclaimer, the term of this patent is extended or adjusted under 35 U.S.C. 154(b) by 9 days.

(21) Appl. No.: 11/402,871

(22) Filed: Apr. 13, 2006

(65) Prior Publication Data

US 2007/0158719 A1  Jul. 12, 2007

(30) Foreign Application Priority Data

Jan. 11, 2006  (TW) .............................. 95100997 A

(51) Int. Cl.
*H01L 27/108* (2006.01)

(52) U.S. Cl. .............................. 257/296; 257/E21.637; 257/329; 438/268

(58) Field of Classification Search ................ 257/296, 257/E21.637, E21.673; 438/216, 287
See application file for complete search history.

(56) References Cited

U.S. PATENT DOCUMENTS

| | | | | |
|---|---|---|---|---|
| 5,006,909 A | * | 4/1991 | Kosa ........................... | 257/302 |
| 5,382,540 A | * | 1/1995 | Sharma et al. ............... | 438/259 |
| 5,612,559 A | * | 3/1997 | Park et al. .................... | 257/302 |
| 5,627,390 A | * | 5/1997 | Maeda et al. ................. | 257/302 |
| 5,929,477 A | * | 7/1999 | McAllister Burns et al. | 257/306 |
| 6,638,823 B2 | * | 10/2003 | Cho et al. .................... | 438/268 |
| 6,946,700 B2 | * | 9/2005 | Noble ........................... | 257/302 |
| 2002/0140032 A1 | * | 10/2002 | Cho et al. .................... | 257/347 |
| 2003/0075758 A1 | * | 4/2003 | Sundaresan et al. ......... | 257/329 |
| 2006/0125123 A1 | * | 6/2006 | Abbott .......................... | 257/908 |

OTHER PUBLICATIONS

Takashi Ohsawa et al, "Memory Design Using a One-Transistor Gain Cell on SOI." Nov. 2002. IEEE Journal of Solid-State Circuits, vol. 37, pp. 1510-1522.

* cited by examiner

*Primary Examiner*—Jerome Jackson
*Assistant Examiner*—Paul A Budd
(74) *Attorney, Agent, or Firm*—Oliff & Berridge, PLC

(57) ABSTRACT

A dynamic random access memory structure having a vertical floating body cell includes a semiconductor substrate having a plurality of cylindrical pillars, an upper conductive region positioned on a top portion of the cylindrical pillar, a body positioned below the upper conductive portion in the cylindrical pillar, a bottom conductive portion positioned below the body in the cylindrical pillar, a gate oxide layer surrounding the sidewall of the cylindrical pillar and a gate structure surrounding the gate oxide layer. The upper conductive region serves as a drain electrode, the bottom conductive region serves as a source electrode and the body can store carriers such as holes. Preferably, the dynamic random access memory structure further comprises a conductive layer positioned on the surface of the semiconductor substrate to electrically connect the bottom conductive regions in the cylindrical pillars.

14 Claims, 10 Drawing Sheets

DYNAMIC RANDOM ACCESS MEMORY STRUCTURE

BACKGROUND OF THE INVENTION (A) Field of the Invention

The present invention relates to a dynamic random access memory (DRAM) structure and method for preparing the same, and more particularly, to a dynamic random access memory structure having vertical floating body memory cells and method for preparing the same.

(B) Description of the Related Art

A memory cell of the DRAM generally consists of a metal oxide semiconductor field effect transistor and a capacitor on a silicon substrate, and the transistor includes a source electrode electrically connected to an upper storage plate of the capacitor. There are two types of capacitors: stack capacitors and deep trench capacitors. The stack capacitor is fabricated on the surface of the silicon substrate, while the deep trench capacitor is fabricated inside the silicon substrate. Recently, the integration of the DRAM has increased with the innovation of semiconductor fabrication technology rapidly. However, the size of the memory cell must be shrunk to achieve the purpose of high integration, i.e., increasing the integration needs to reduce the size of the transistor and the capacitor.

In 2002, Takahsi Ohasawa et al. discloses a new dynamic random access memory cell called floating body cell (FBC) (see: "Memory Design Using One-Transistor Gain Cell on SOI", ISSCC Digest of Technical Paper, PP152-153). The floating body cell consists of a metal oxide semiconductor field effect transistor having a floating body on an expensive substrate of silicon on insulator (SOI), and the floating body serves to store carriers. Compared to the conventional one-transistor/one-capacitor memory cell using the capacitor to storing charges, the floating body cell stores the charges in the floating body without using an additional capacitor. Hence, the floating body cell has a simpler memory structure, smaller occupying area per memory cell and higher integration than the conventional one-transistor/one-capacitor memory cell.

Further, the conventional one-transistor/one-capacitor memory cell checks whether the stored data is "1" or "0" by comparing a read out voltage from the memory cell with a reference voltage. Comparatively, the floating body cell checks whether the stored data is "1" or "0" based on the magnitude of a read out current. However, the floating body cell stores the carriers around an interface between two different materials, and defects in the interface is likely to recombine with the carriers, which influences the retention time of the carriers in the floating body.

SUMMARY OF THE INVENTION

The primary objective of the present invention is to provide a dynamic random access memory structure having vertical floating body memory cells and method for preparing the same, which stores the carriers in the center of a vertically disposed floating body rather than in an interface between different material so as to have a longer retention time to the prevention of the recombination of the carrier with defects in the interface.

In order to achieve the above-mentioned objective and avoid the problems of the prior art, one embodiment of the present invention discloses a dynamic random access memory structure having vertical floating body memory cells. The dynamic random access memory structure comprises a substrate having a plurality of cylindrical pillars, a gate oxide layer positioned on a sidewall of each of the cylindrical pillars, and a gate structure positioned on a surface of the gate oxide layer. Each pillar comprises an upper conductive region positioned on a top portion of the pillar, a body positioned below the upper conductive region in the pillar and a bottom conductive region positioned below the body in the pillar. The upper conductive region serves as a drain electrode, the bottom conductive region serves as a source electrode and the body is capable of storing carriers. Preferably, the dynamic random access memory structure further comprises a conductive layer positioned on the substrate, and the bottom conductive region in the pillar contacts the conductive layer.

According to another embodiment of the present invention, the dynamic random access memory structure further comprises an oxide layer positioned on the substrate and in a bottom portion of the pillar, wherein the bottom conductive region is positioned above the oxide layer in the pillar. In addition, the dynamic random access memory structure further comprises a conductive block positioned between two adjacent pillars to electrically connect the two bottom conductive regions in the two adjacent pillars.

According to one embodiment of the present invention, a method for preparing a dynamic random access memory structure comprises steps of forming a bottom conductive region in a substrate, removing a predetermined portion of the substrate to form a plurality of pillars having a bottom end lower than a bottom surface of the bottom conductive region, forming a first oxide layer on the substrate and below the bottom conductive region in the pillar, forming a conductive block between two adjacent pillars to electrically connect the two bottom conductive regions in the two adjacent pillars, forming a second oxide layer covering the conductive block, forming a gate oxide layer on a sidewall of the pillar, forming a gate structure on the surface of the gate oxide layer and forming an upper conductive region on a top portion of the pillar.

The conventional floating body cell is horizontally positioned and prepared on an expensive SOI substrate. Inversely, the dynamic random access memory structure of the present invention possesses one advantage of occupying a smaller area for increasing integration since the floating body memory cell is vertically positioned. Further, the stored carriers stay in most cases at the center of the cylindrical body, which is not likely to recombine with the defects in the interface such as the surface of the pillar; hence, the carriers will have a longer retention time according to the present invention. In addition, the preparation of the vertical floating body memory cell can use the silicon substrate and the LOCOS process to form silicon on insulator structure rather than using the expensive SOI substrate as the prior art does; therefore, the present invention can dramatically decrease the fabrication cost.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
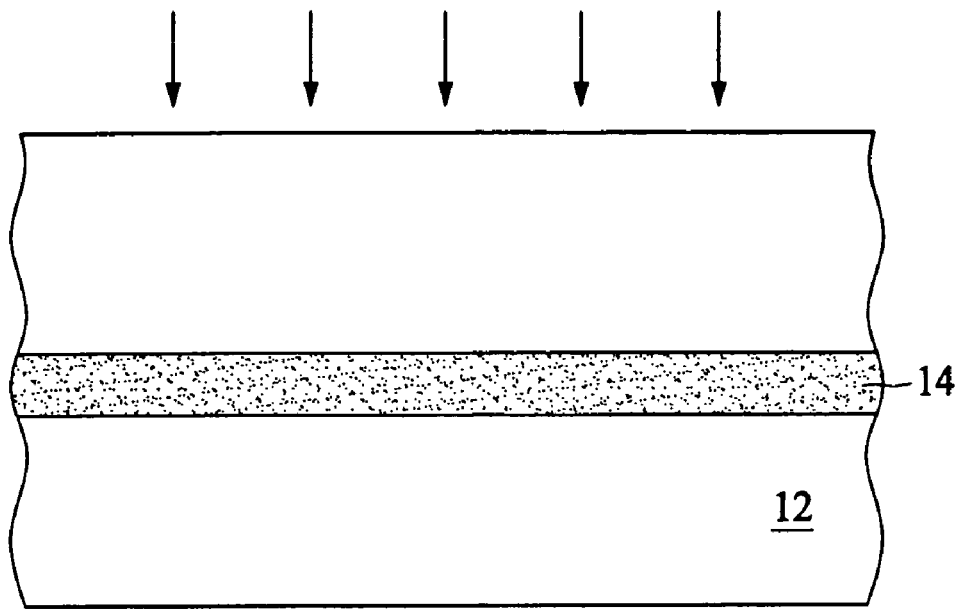
FIG. 1 to FIG. 6 illustrate a method for preparing a dynamic random access memory structure according to one embodiment of the present invention.
Figure 2:
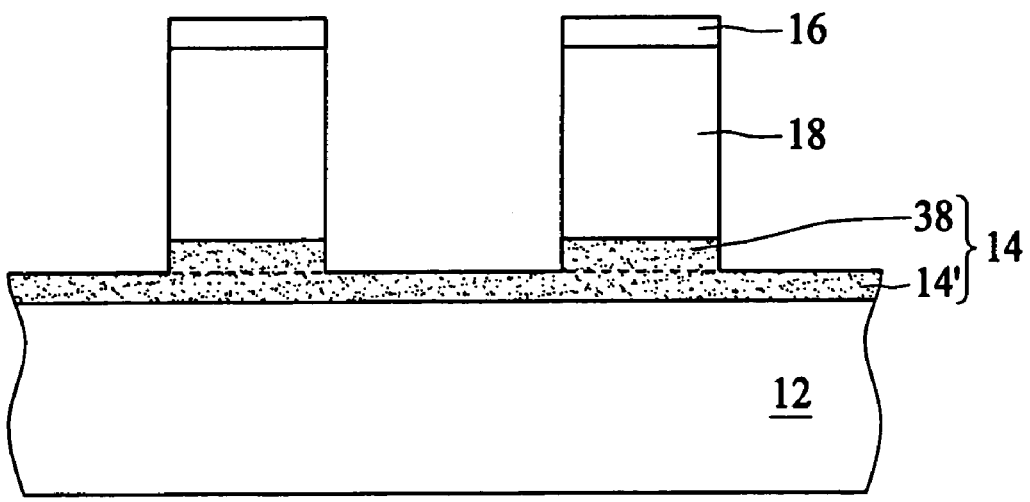

FIG. 1 to FIG. 6 illustrate a method for preparing a dynamic random access memory structure 10 according to one embodiment of the present invention. First, an implanting process is performed to implant ions into a predetermined depth in a semiconductor substrate 12 such as a silicon substrate to form a conductive layer 14 in the semiconductor substrate 12. Subsequently, a mask layer 16 is formed on the semiconductor substrate 12 and an etching process is then performed to remove a portion of the semiconductor substrate 12 not covered by the mask layer 16 down to the interior of the conductive layer 14 in the semiconductor substrate 12 to form a plurality of cylindrical pillars 18. Particularly, the conductive layer 14 can be regarded as two portions, i.e., a bottom conductive region 38 at the bottom portion of the cylindrical pillar 18 and a conductive layer 14' on the surface of the semiconductor substrate 12, as shown in FIG. 2.

Figure 3:
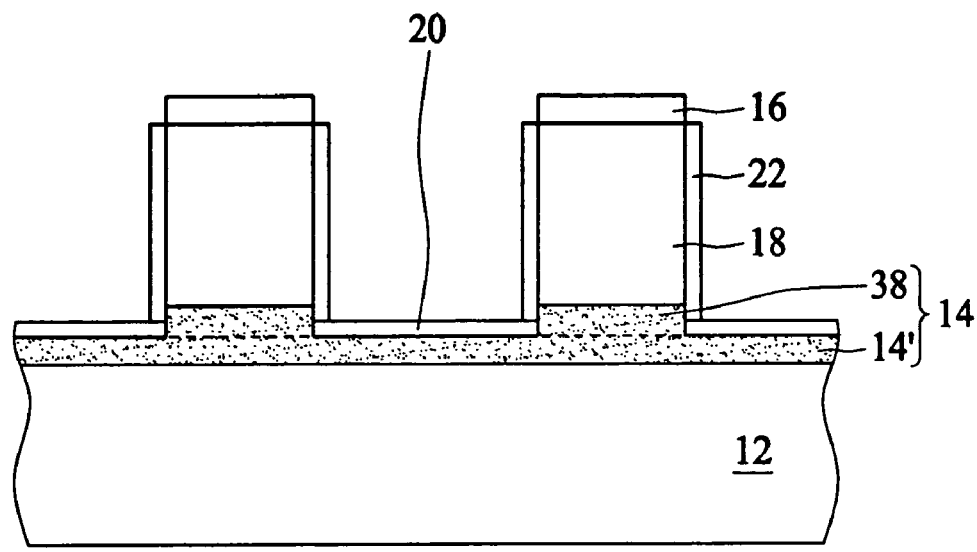
Figure 4:
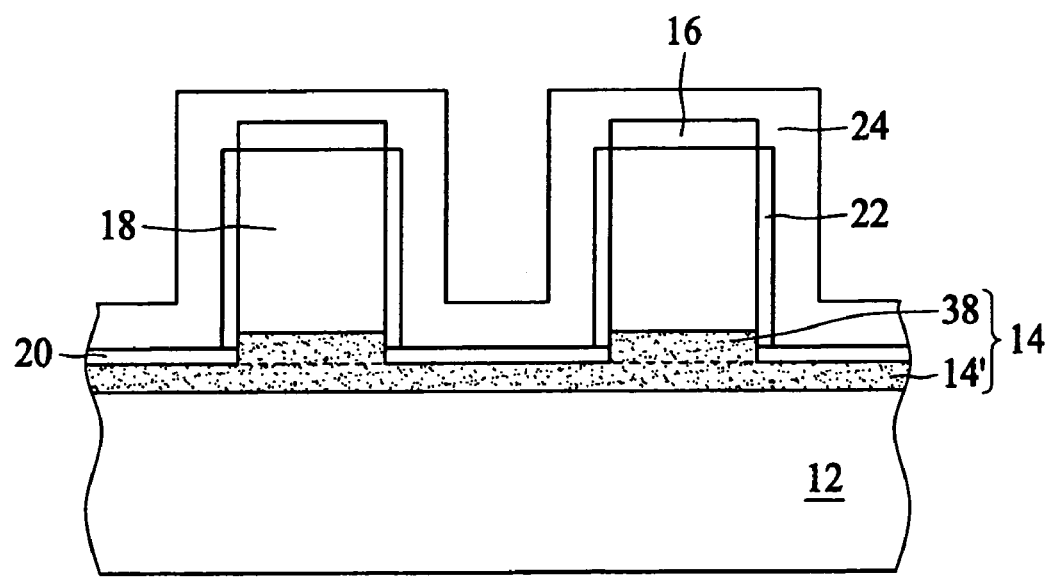

Referring to FIG. 3, a deposition process and a recessing process are performed to form an oxide layer 20 on the exposed semiconductor substrate 12 and thermal oxidation process is performed to form a gate oxide layer 22 on the sidewall of the cylindrical pillar 18. Subsequently, a deposition process is performed to form a doped polysilicon layer 24 covering the cylindrical pillar 18 and the surface of the semiconductor substrate 12, as shown in FIG. 4.

Figure 5:
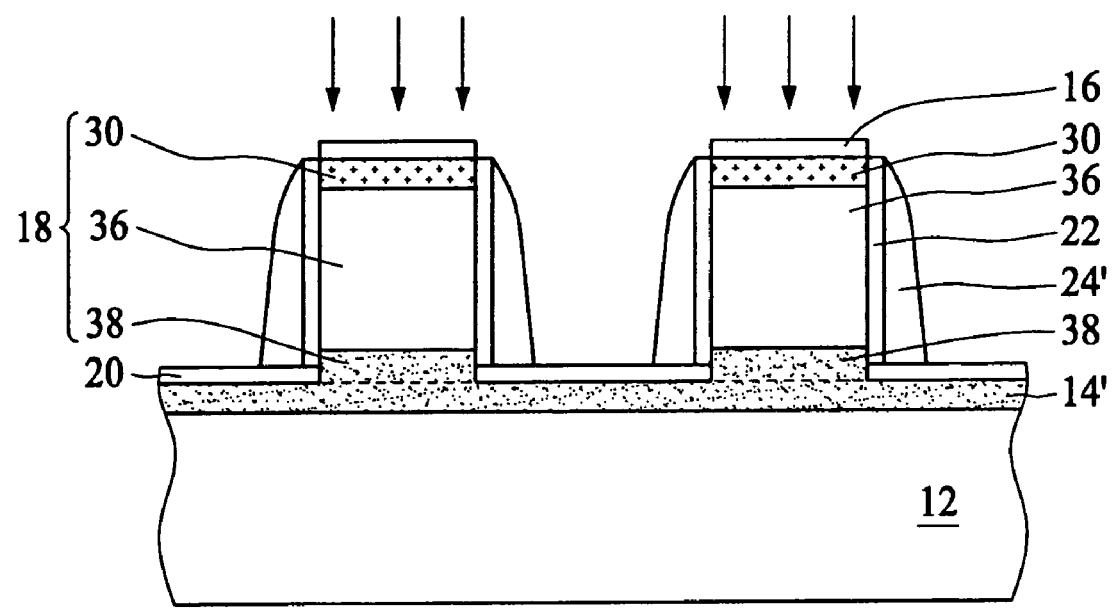

Referring to FIG. 5, an anisotropic etching process is performed to remove a portion of the doped polysilicon layer 24 to form a gate structure 24' having a spacer profile. Particularly, the gate oxide layer 22 surrounds the sidewall of the cylindrical pillar 18 and the gate structure 24' surrounds the gate oxide layer 22. Subsequently, an implanting process is performed to implant ions into a top portion of the cylindrical pillar 18 to form an upper conductive region 30. Particularly, the upper conductive region 30 serves as a drain electrode, the bottom conductive region 38 serves as a source electrode, and the cylindrical body 18 between the upper conductive region 30 and the bottom conductive region 38 serves as a body 36 for storing the carriers.

Figure 6:
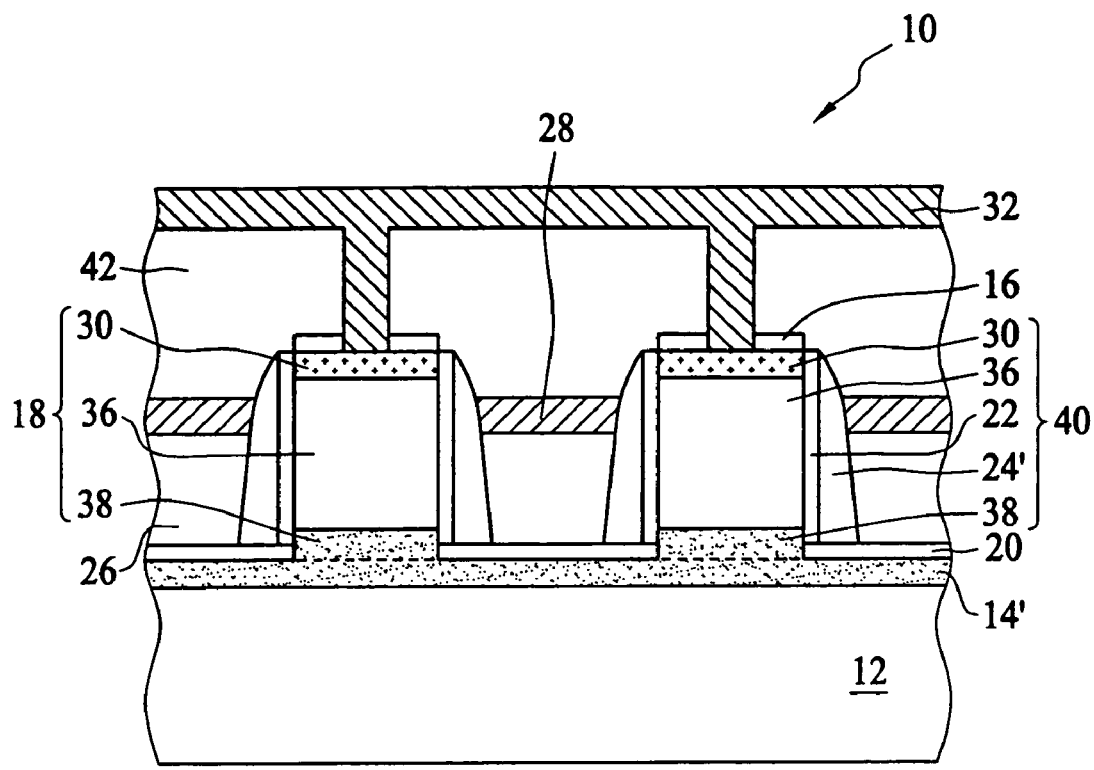

Referring to FIG. 6, a deposition process and an etching back process are performed to form a first dielectric layer 26 on the semiconductor substrate 12. The lithographic process, the etching process and the deposition process are used to form a conductive block 28 between two adjacent cylindrical pillars 18 to electrically connect the two gate structure 24' on the sidewalls of the two adjacent cylindrical pillars 18 so as to form a word line. Subsequently, a second dielectric layer 42 is formed to cover the conductive block 28, and the lithographic process, the etching process and the deposition process are then used to form a bit line 32, which electrically connects the upper conductive region 30 serving as the drain electrode on the top potion of the cylindrical pillar 18. Particularly, the bottom conductive region 38, the body 36, the upper conductive region 30, the gate oxide layer 22 and the gate structure 24' form a vertical floating body memory cell 40. The bit line 32 can be optionally positioned in parallel or in perpendicular to the word line since they are in different levels.

Figure 7:
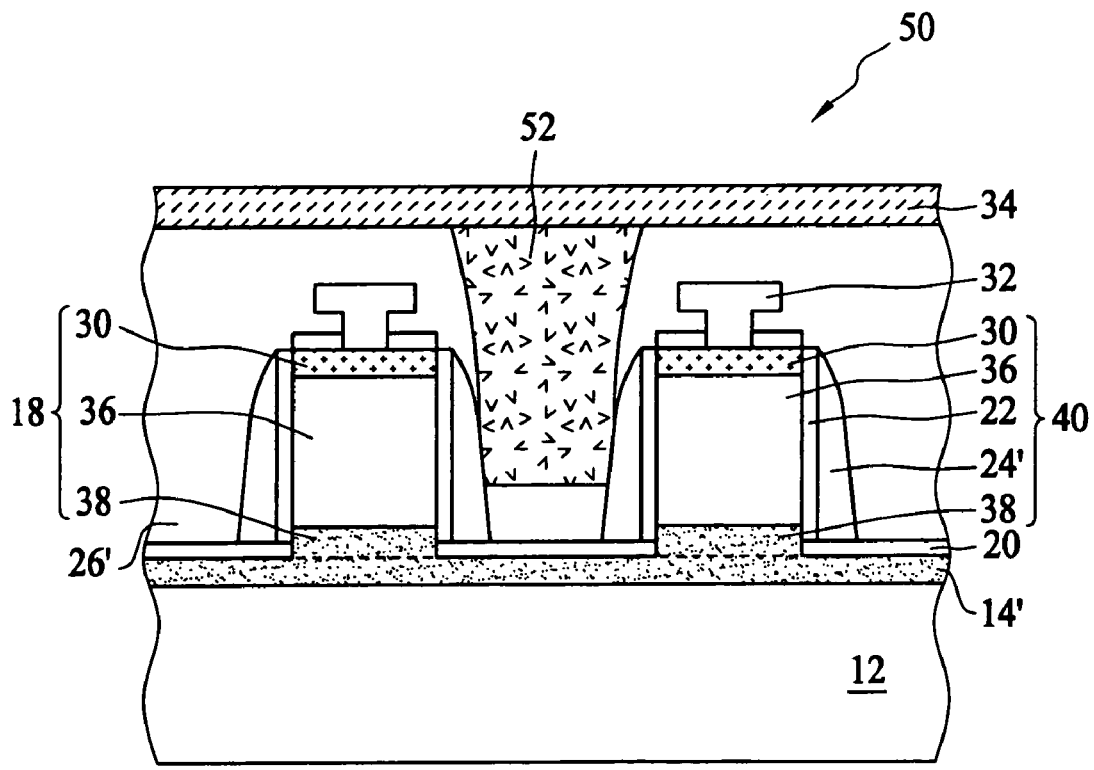
FIG. 7 and FIG. 8 illustrate a method for preparing a dynamic random access memory structure according to another embodiment of the present invention.
Figure 8:
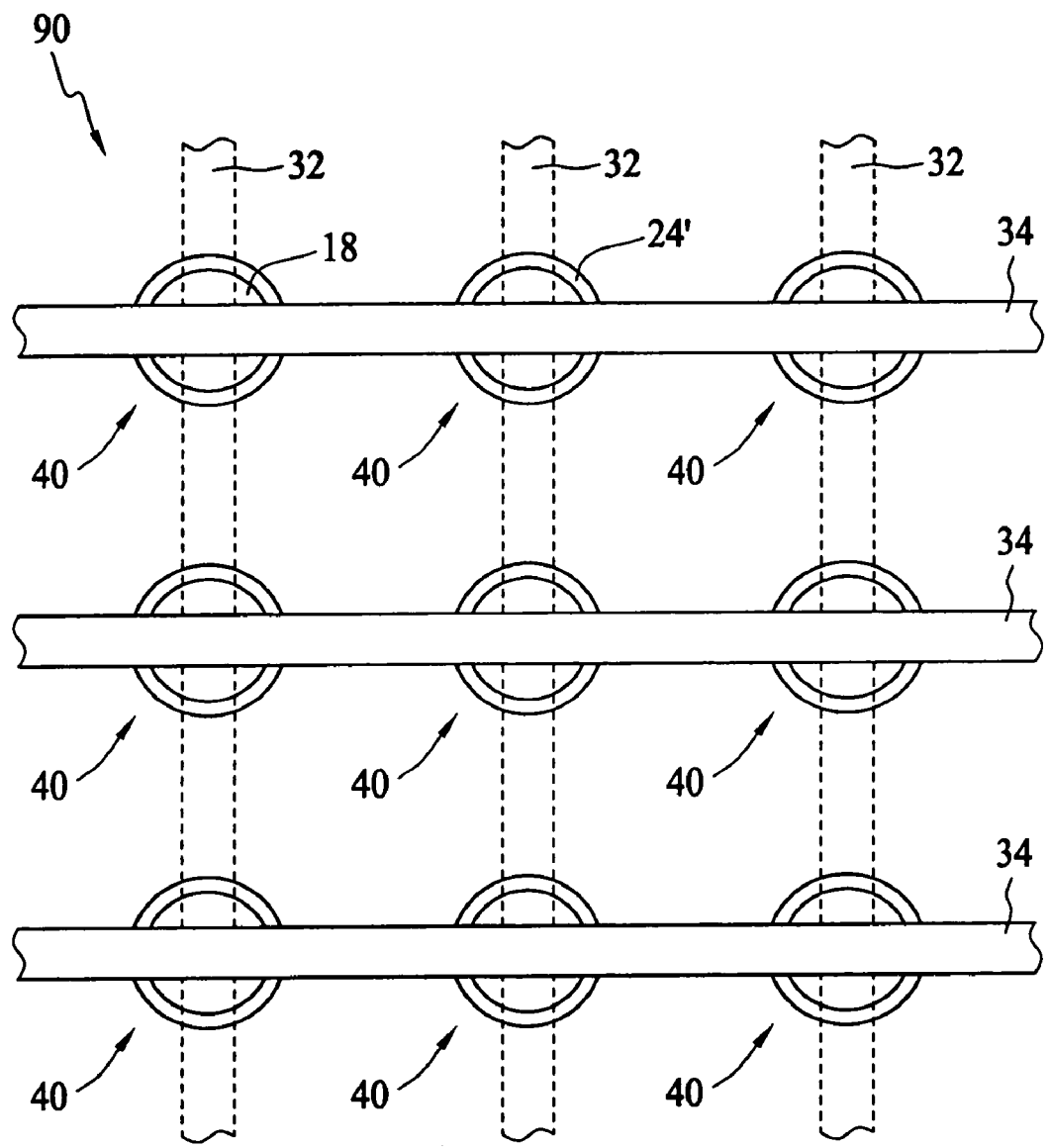
Figure 9:
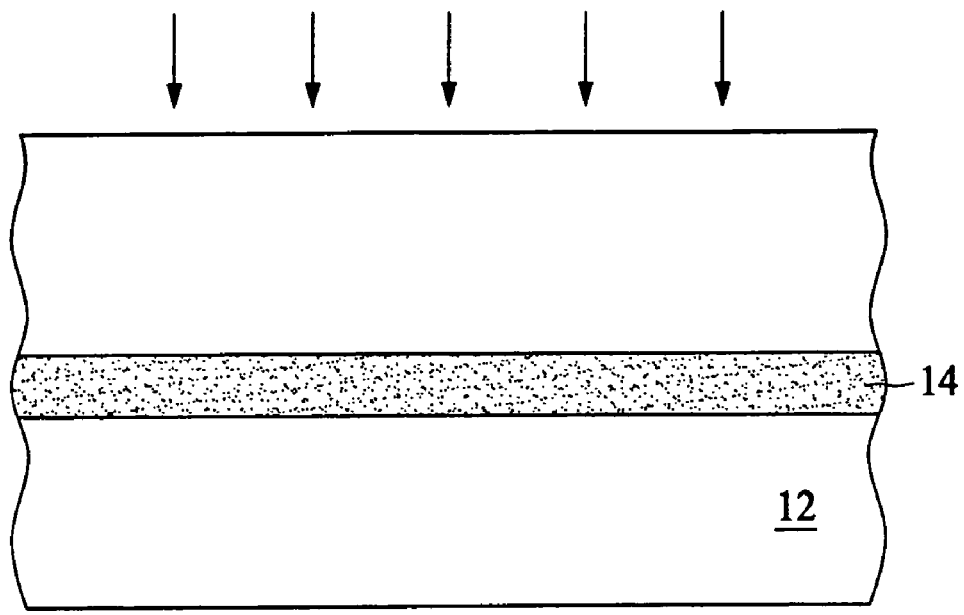
FIG. 9 to FIG. 14 illustrate a method for preparing a dynamic random access memory structure according to another embodiment of the present invention.

FIG. 7 and FIG. 8 illustrate a method for preparing a dynamic random access memory structure 50 according to another embodiment of the present invention. Compared to the dynamic random access memory structure 10 using the conductive block 28 to electrically connect two gate structures 24' in two adjacent cylindrical pillars 18 to form a word line as shown in FIG. 6, the dynamic random access memory structure 50 in FIG. 7 uses a contact plug 52 to electrically connect the gate structure 24' on the sidewall of the cylindrical pillar 18 to a word line 34 above the bit line 32. The contact plug 52 can be prepared by depositing a thicker first dielectric layer 26', etching the first dielectric layer 26' to form a contact hole, and depositing plug metal in the contact hole, wherein the thicker first dielectric layer 26' is deposited both after the formation of the gate structure 24' and after the formation of the bit line 32. The bit line 32 of the dynamic random access memory structure 50 cannot be positioned in parallel to the word line 34, but in perpendicular to the word line 34, as shown in FIG. 7.

According to one embodiment of the present invention, the dynamic random access memory array 90 comprises a plurality of floating body memory cells 40, a plurality of bit lines 32 and a plurality of word lines 34, wherein these floating body memory cells 40 are positioned on the semiconductor substrate 12 in a plurality of columns and rows manner. Each bit line 32 connects the upper conductive regions 30 of the floating body memory cells 40 in the same row and each word line 34 connects the gate structures 24' of the floating body memory cells 40 in the same column. Further, the bottom conductive regions 38 of the floating body memory cells 40 in a predetermined area are connected to each other via the conductive layer 14' to form a common source.

Figure 10:
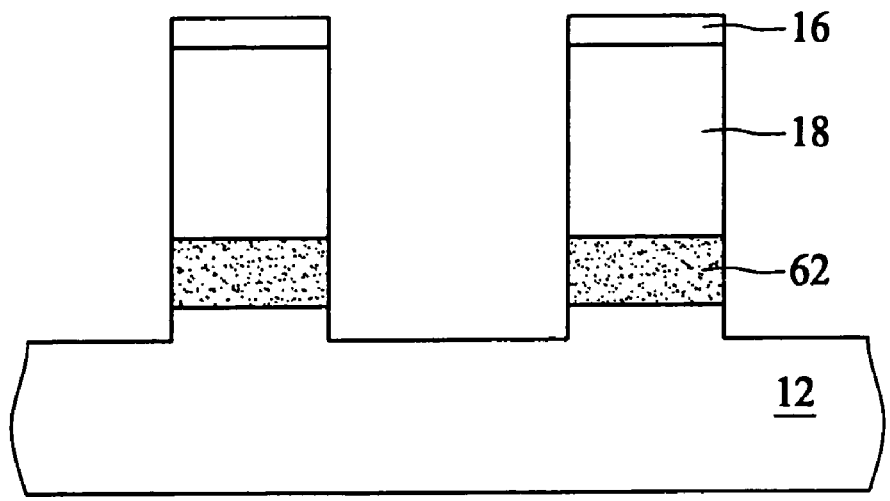

FIG. 9 to FIG. 14 illustrate a method for preparing a dynamic random access memory structure 60 according to another embodiment of the present invention. An implanting process is performed to implant ions into a semiconductor substrate 12 to form a conductive layer 14 in the semiconductor substrate 12, and a mask layer 16 is then formed on the semiconductor substrate 12. Subsequently, an etching process is performed to remove a portion of the semiconductor substrate 12 not covered by the mask layer to form a plurality of cylindrical pillars 18 having a bottom end lower than a bottom surface of the conductive layer 14, wherein the remained conductive layer 14 in the cylindrical pillar 18 can be regarded as a bottom conductive region 62, as shown in FIG. 10.

Figure 11:
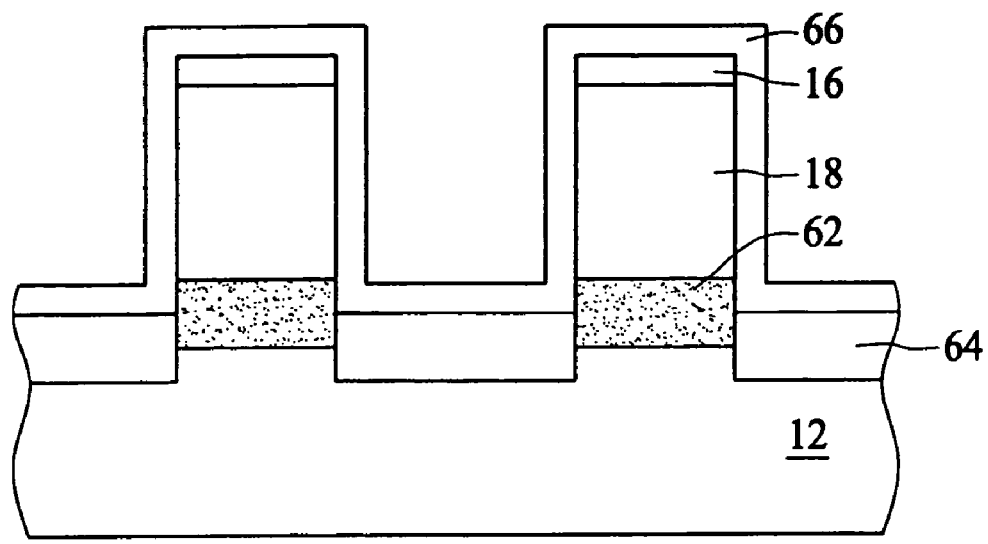
Figure 12:
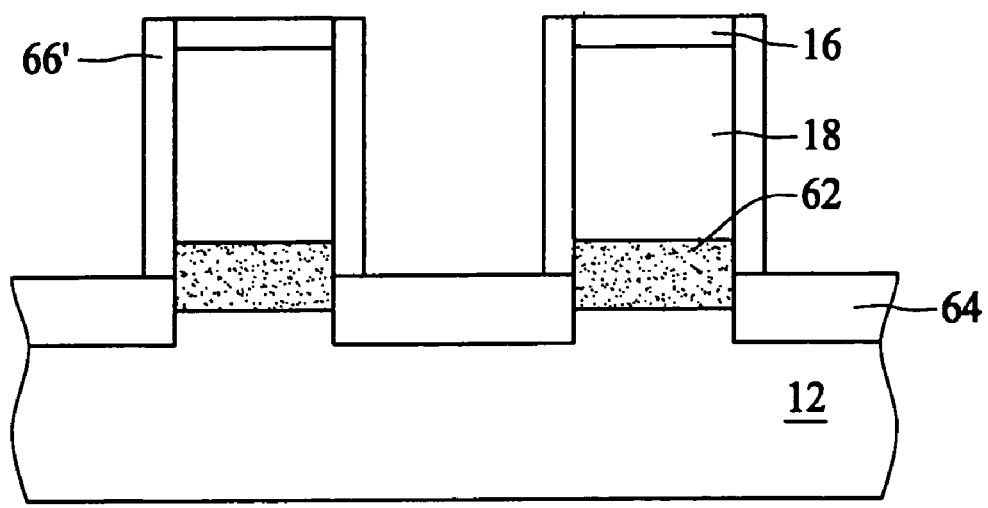

Referring to FIG. 11, an oxide layer 64 is formed on the semiconductor substrate 12, and an etching process is then performed to remove the oxide layer 64 above a predetermined depth to expose a portion of the cylindrical pillar 18. Subsequently, a deposition process is performed to form a dielectric layer 66 made of silicon nitride on the semiconductor substrate 12 and covering the exposed portion of the cylindrical pillar 18. An etching process is then performed to remove a portion of the dielectric layer 66 from the surface of the semiconductor substrate 12 to form a collar dielectric layer 66' encapsulating a portion of the sidewall of the cylindrical pillar 18, as shown in FIG. 12.

Figure 13:
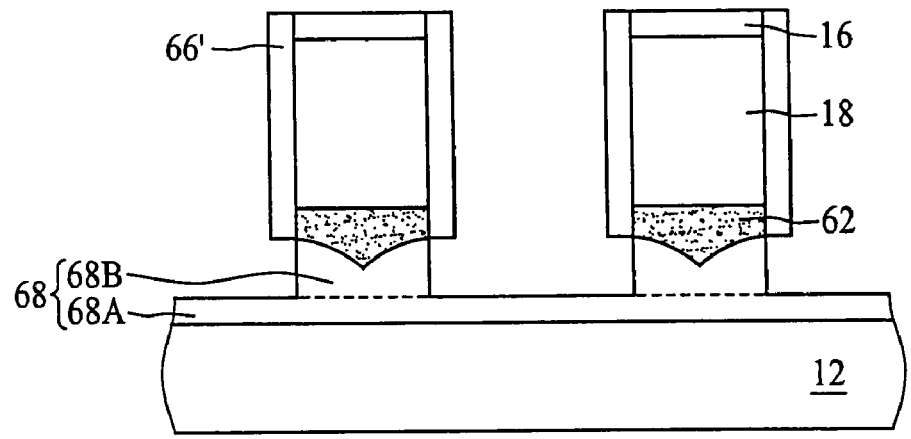
Figure 14:
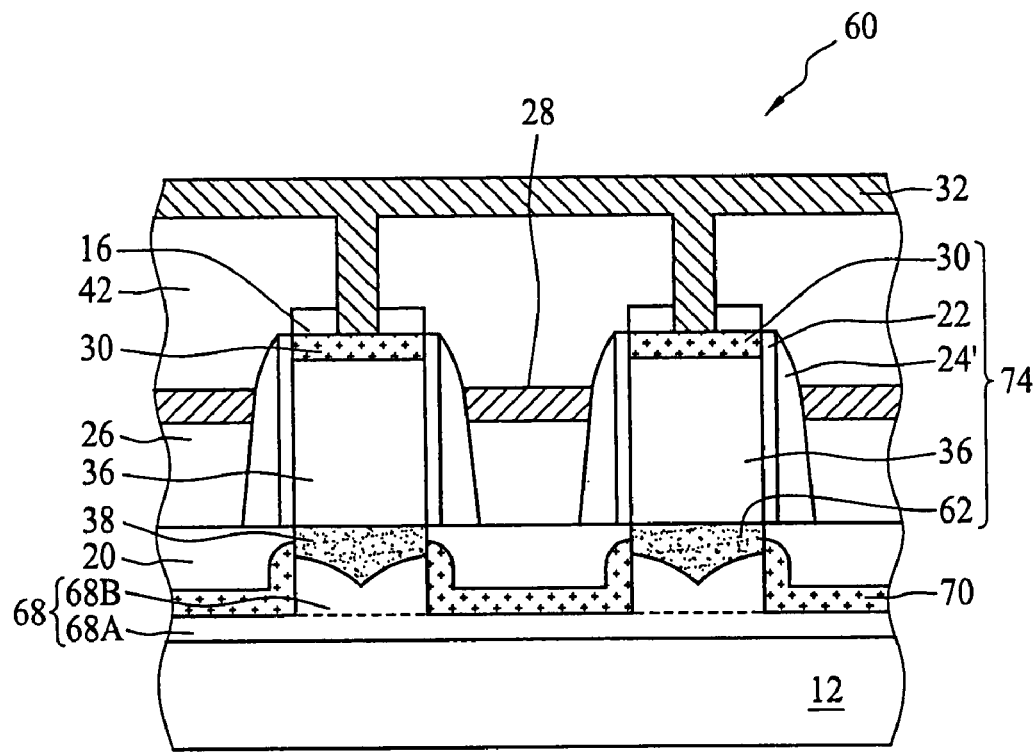
Figure 15:
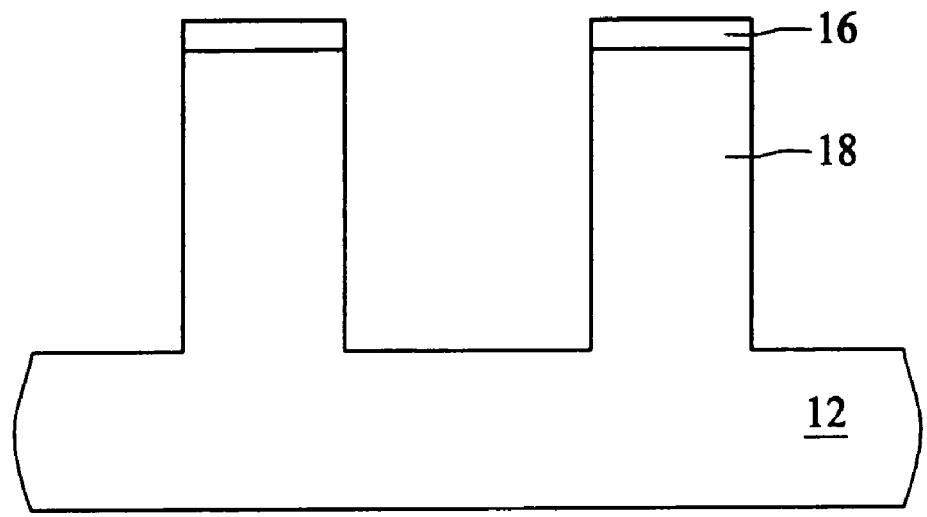
FIG. 15 to FIG. 18 illustrate a method for preparing a dynamic random access memory structure according to another embodiment of the present invention.

Referring to FIG. 13, the oxide layer 64 is removed from the surface of the semiconductor substrate 12 and a thermal oxidation process is then performed to form an oxide layer 68 on the surface of the semiconductor substrate 12 and on a portion of the sidewall of the cylindrical pillar 18 not encapsulated by the collar dielectric layer 66', i.e., performing a local oxidation of silicon (LOCOS) process. In particular, the oxide layer 68 includes a base 68A and a protrusion 68B positioned in the bottom of the pillar 18, and the bottom conductive region 62 is sandwiched between the protrusion 68B and the body 36. Subsequently, the collar dielectric layer 66' is removed from the sidewall of the cylindrical pillar 18 and a conductive block 70 is formed between the cylindrical pillars 18 by deposition and etching processes, wherein the conductive block 70 has a top end higher than the oxide layer 68 in the cylindrical pillar 18 for electrically connecting the bottom conductive regions 62 in two adjacent cylindrical pillars 18. The processes shown in FIG. 3 to FIG. 6 are then performed to complete the dynamic random access memory structure 60, as shown in FIG. 14. Particularly, the gate oxide layer 22, the gate structure 24', the upper conductive region 30, the body 36 and the bottom conductive region 62 form a vertical floating body memory cell 74.

Figure 16:
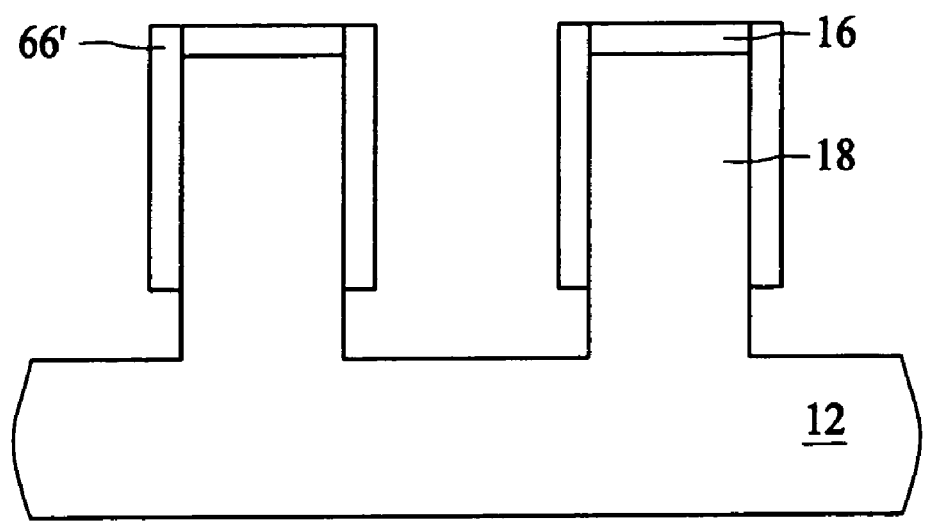

FIG. 15 to FIG. 18 illustrate a method for preparing a dynamic random access memory structure 80 according to another embodiment of the present invention. A mask layer 16 is formed on a semiconductor substrate 12, and an etching process is then performed to remove a portion of the semiconductor substrate 12 not covered by the mask layer 16 down to predetermined depth to form a plurality of cylindrical pillars 18. Subsequently, the processes shown in FIG. 11 and FIG. 12 are performed to form a collar dielectric layer 66' encapsulating a predetermined portion of the sidewall of the cylindrical pillar 18, as shown in FIG. 16.

Figure 17:
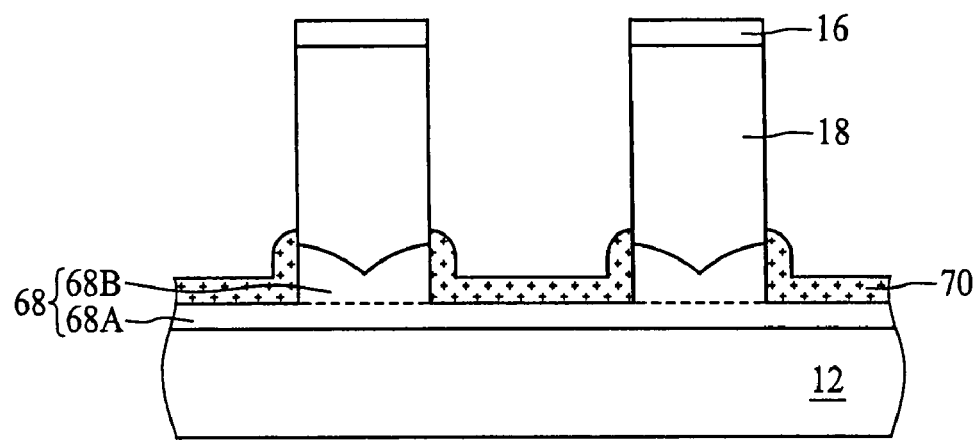

Referring to FIG. 17, a thermal oxidation process is performed to form an oxide layer 68 on the surface of the semiconductor substrate 12 and in a portion of the cylindrical pillar 18 whose sidewall is not encapsulated by the collar dielectric layer 66'. Subsequently, the collar dielectric layer 66' is removed from the sidewall of the cylindrical pillars 18, and a conductive block 70 is formed between the cylindrical pillars 18 by deposition and etching processes. Particularly, the conductive block 70 has a top end higher than that of the oxide layer 68 in the pillar 18, and is preferably made of doped polysilicon.

Figure 18:
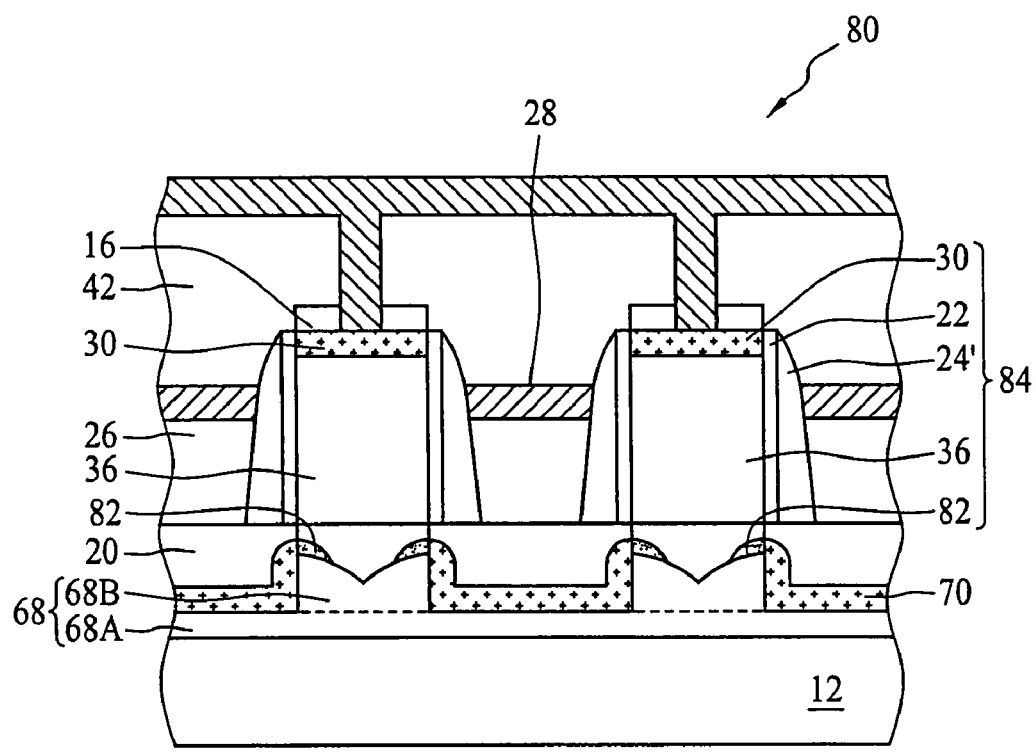

Referring to FIG. 18, a thermal treating process is performed to diffuse the ions from the conductive block 70 made of doped polysilicon into the cylindrical pillar 18 to form a bottom conductive region 82 above the oxide layer 68 in the pillar 18. Subsequently, the processes in FIG. 3 to FIG. 6 are performed to complete the dynamic random access memory structure 80. Particularly, the gate oxide layer 22, the gate structure 24', the upper conductive region 30, the body 36 and the bottom conductive region 82 form a vertical floating body memory cell 84.

To write data "1" into the vertical floating body memory cell 40 (the same to the other vertical floating body memory cell shown in other embodiment), the bottom conductive region 38 serving as the source electrode is grounded and a positive voltage is applied to the upper conductive region 30 serving as the drain electrode and the gate structure 24' so that the vertical floating body memory cell 40 operates in the saturation region and holes are injected into the body 36 to write data "1". To write data "0" into the vertical floating body memory cell 40, the bottom conductive region 38 is grounded, a positive voltage is applied to the gate structure 24' and a negative voltage is applied to the upper conductive region 30 so that the PN junction is forward biased and holes are ejected to the upper conductive region 30 to write data "0".

To read data stored in the vertical floating body memory cell 40, the bottom conductive region 38 is grounded and a positive voltage smaller than that is writing process is applied to the upper conductive region 30 and the gate structure 24' so that the vertical floating body memory cell 40 operates in the linear region and the magnitude of the drain current depends on the number of the holes in the body 36. Consequently, whether the data stored in the vertical floating body memory cell 40 is "1" or "0" can be decided based on the magnitude of the read out drain current. Particularly, a positive voltage is applied to the gate structure 24' surrounding the cylindrical body 36 that stores the carriers (holes) during the writing and reading process; hence, the carriers in most cases stay at the center of the cylindrical body 36, which is not likely to recombine with the defects at the interface. As a result, the carriers will have a longer retention time.

In addition, the preparation of the vertical floating body memory cell 40 can use the silicon substrate 12 and the LOCOS process to form silicon on insulator structure rather than using the expensive SOI substrate as the prior art does; therefore, the present invention can dramatically decrease the fabrication cost. Further, the width of the transistor in the vertical floating body memory cell 40 can be increased by increasing the height of the cylindrical pillar 18 rather than by increasing the occupied silicon area, which is very suitable to be applied in the advance high integration design.

The above-described embodiments of the present invention are intended to be illustrative only. Numerous alternative embodiments may be devised by those skilled in the art without departing from the scope of the following claims.

What is claimed is:

1. A dynamic random access memory structure, comprising:
    a substrate having a plurality of pillars, each pillar including:
        an upper conductive region positioned on a top portion of the pillar;
        a body capable of storing carriers positioned below the upper conductive region in the pillar; and
        a bottom conductive region positioned below the body in the pillar;
    a gate oxide layer positioned on a sidewall of the pillar;
    a gate structure positioned on a surface of the gate oxide layer; and
    an oxide layer including a base positioned on the substrate and a protrusion in a bottom portion of the pillar, the bottom conductive region being sandwiched between the protrusion and the body,
    wherein the pillar is cylindrical.

2. The dynamic random access memory structure of claim 1, wherein the gate oxide layer surrounds the sidewall of the pillar and the gate structure surrounds the gate oxide layer.

3. The dynamic random access memory structure of claim 1, wherein the upper conductive region serves as a drain electrode and the bottom conductive region serves as a source electrode.

4. The dynamic random access memory structure of claim 1, further comprising a conductive layer positioned on the substrate, the bottom conductive region in the pillar contacting the conductive layer.

5. The dynamic random access memory structure of claim 1, further comprising a conductive block positioned between two adjacent pillars to electrically connect the two bottom conductive regions in the two adjacent pillars.

6. The dynamic random access memory structure of claim 5, wherein the conductive block has a top end higher than the oxide layer in the bottom portion of the pillar, and the conductive block is made of polysilicon.

7. The dynamic random access memory structure of claim 1, further comprising a conductive block positioned between two adjacent pillars to electrically connect the two gate structures on the two adjacent pillars.

8. A dynamic random access memory array, comprising:
    a plurality of memory cells positioned on a substrate in a plurality of columns and rows manner, each memory cell including:
        a pillar positioned on the substrate, including:
            an upper conductive region positioned on a top portion of the pillar;

a body capable of storing carriers positioned below the upper conductive region in the pillar;

a bottom conductive region positioned below the body in the pillar;

a gate oxide layer positioned on a sidewall of the pillar; and a gate structure positioned on a surface of the gate oxide layer;

an oxide layer positioned on the substrate and in a bottom portion of the pillar, the bottom conductive region being sandwiched between the oxide layer and the body;

a plurality of bit lines, each bit line connecting the upper conductive regions of the memory cells in the same row; and a plurality of word lines, each word line connecting the gate structures of the memory cells in the same column, wherein the pillar is cylindrical.

9. The dynamic random access memory array of claim 8, further comprising a conductive block positioned between two adjacent pillars to electrically connect the two gate structures on the two adjacent pillars, the word line connecting the conductive block.

10. The dynamic random access memory array of claim 8, wherein the bottom conductive regions of the memory cells in a predetermined area are connected to each other.

11. The dynamic random access memory array of claim 10, further comprising a conductive block positioned between two adjacent pillars to electrically connect the two bottom conductive regions in the two adjacent pillars.

12. The dynamic random access memory array of claim 10, further comprising a conductive layer positioned on the substrate, the bottom conductive region contacting the conductive layer.

13. The dynamic random access memory array of claim 8, wherein the gate oxide layer surrounds the sidewall of the pillar and the gate structure surrounds the gate oxide layer.

14. The dynamic random access memory array of claim 8, wherein the upper conductive region serves as a drain electrode and the bottom conductive region serves as a source electrode.

* * * * *